(12) United States Patent
Dupont et al.

(10) Patent No.: US 11,032,931 B2
(45) Date of Patent: Jun. 8, 2021

(54) ELECTRICAL HOUSING AND PROCESS FOR TESTING THE SEALED NATURE OF THE ELECTRICAL HOUSING

(71) Applicant: Tyco Electronics France SAS, Pontoise (FR)

(72) Inventors: Bruno Dupont, Paris (FR); Jose Ferreira, Auvers sur Oise (FR); Christian Volantin, Ste Honorine (FR)

(73) Assignee: Tyco Electronics France SAS, Pontoise (FR)

( * ) Notice: Subject to any disclaimer, the term of this patent is extended or adjusted under 35 U.S.C. 154(b) by 153 days.

(21) Appl. No.: 16/358,053

(22) Filed: Mar. 19, 2019

(65) Prior Publication Data

US 2019/0289739 A1 Sep. 19, 2019

(30) Foreign Application Priority Data

Mar. 19, 2018 (FR) ...................... 1852321

(51) Int. Cl.
| | |
|---|---|
| *H05K 5/06* | (2006.01) |
| *G01M 3/32* | (2006.01) |
| *H05K 5/02* | (2006.01) |
| *H01R 13/52* | (2006.01) |

(52) U.S. Cl.
CPC ............. *H05K 5/069* (2013.01); *G01M 3/32* (2013.01); *G01M 3/3236* (2013.01); *H01R 13/52* (2013.01); *H05K 5/0247* (2013.01)

(58) Field of Classification Search
CPC . G01M 3/3236; H01R 13/443; H05K 5/0247; H05K 5/069
See application file for complete search history.

(56) References Cited

U.S. PATENT DOCUMENTS

| | | | | |
|---|---|---|---|---|
| 5,596,138 A | * | 1/1997 | Onodera | G01M 3/26 73/49.2 |
| 5,703,280 A | * | 12/1997 | Igura | G01M 3/26 73/40 |
| 6,599,144 B1 | * | 7/2003 | Schumann | G01M 3/26 439/219 |
| 10,215,742 B2 | * | 2/2019 | Choi | G01N 33/0009 |
| 2006/0130560 A1 | * | 6/2006 | Shamine | F02M 55/002 73/40 |
| 2014/0165708 A1 | * | 6/2014 | Konrath | G01M 3/3236 73/49.3 |
| 2015/0219608 A1 | * | 8/2015 | Choi | G06F 3/017 73/23.2 |
| 2016/0254612 A1 | * | 9/2016 | Andrei | H05K 5/0004 439/701 |
| 2019/0160316 A1 | * | 5/2019 | Counts | A62C 37/08 |
| 2020/0029453 A1 | * | 1/2020 | Gilmore | H05K 5/0086 |

OTHER PUBLICATIONS

International Electrotechnical Commission Standard IEC 60529, published Aug. 29, 2013, Edition 2.2, 216 pages.

* cited by examiner

*Primary Examiner* — John Fitzgerald
(74) *Attorney, Agent, or Firm* — Barley Snyder

(57) ABSTRACT

An electrical housing comprises an opening adapted to receive an electrical cable and/or an electrical connector, a housing wall delimiting an internal volume of the electrical housing, and a test passageway. The test passageway has a dimension and a position in the housing wall adapted to permit testing of a sealed nature of the electrical housing while impeding access to an electrically live element in the internal volume of the electrical housing.

5 Claims, 4 Drawing Sheets

ELECTRICAL HOUSING AND PROCESS FOR TESTING THE SEALED NATURE OF THE ELECTRICAL HOUSING

CROSS-REFERENCE TO RELATED APPLICATION

This application claims the benefit of the filing date under 35 U.S.C. § 119(a)-(d) of French Patent Application No. 1852321, filed on Mar. 19, 2018.

FIELD OF THE INVENTION

The present invention relates to an electrical housing and, more particularly, to a sealed electrical housing.

BACKGROUND

Electrical housings, for example in the automotive industry, are used to hermetically encapsulate terminals, electrical cables, and/or components which are live, and possibly under high voltage, to protect them from environmental issues such as moisture. These electrical housings, due to their use in automotive vehicles, are also subjected to impacts and/or vibrations.

An electric cabling of such an electrical housing is commonly assembled in the form of harnesses and/or cable bundles. A sealed nature of the electrical housing is tested using one of the electrical cables; air can be injected into an electrical cable at the open space between the cable insulation and its metal conductor. However, given that the length and the dimension of the open space between the insulation and the metal conductor of the electrical cable are difficult to control, this test of the sealed nature of the electrical housing is not sufficiently reliable or repeatable.

SUMMARY

An electrical housing comprises an opening adapted to receive an electrical cable and/or an electrical connector, a housing wall delimiting an internal volume of the electrical housing, and a test passageway. The test passageway has a dimension and a position in the housing wall adapted to permit testing of a sealed nature of the electrical housing while impeding access to an electrically live element in the internal volume of the electrical housing.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
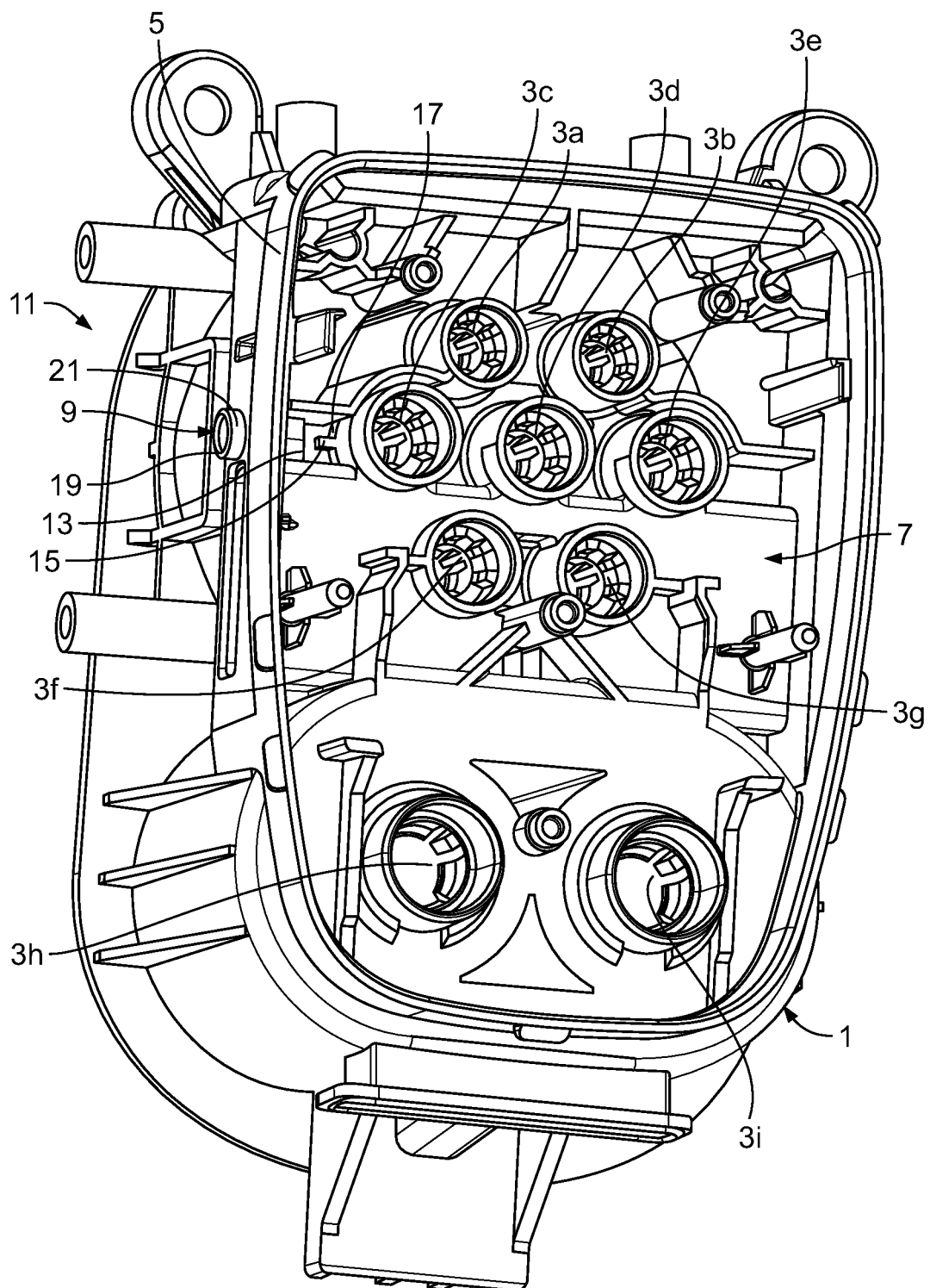
FIG. 1 is a perspective view of an electrical housing according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will convey the concept of the invention to those skilled in the art.

An electrical housing 1 according to an embodiment, as shown in FIG. 1, comprises a cover that makes it possible to hermetically close the electrical housing 1 when the electrical housing 1 is in an assembled state. The electrical housing 1 comprises a plurality of openings 3*a* to 3*i* in a housing wall 5 of the electrical housing 1 for receiving electrical cables and/or electrical connectors. In the assembled state, the electrical housing 1 has electrical cables which are connected to the openings 3*a* to 3*i*. The housing wall 5 delimits an internal volume 7 of the electrical housing 1 when closed by the cover. The internal volume 7 of the electrical housing 1 receives one or more cables and/or electrical connectors which are electrically live, and may be under high voltage (up to 1000 Volts), via the openings 3*a* to 3*i* in order to connect them together or to connect them to one or more of the electrical components.

The housing wall 5, as shown in FIG. 1, has a test passageway 9 extending between an exterior 11 of the electrical housing 1 and the internal volume 7 of the electrical housing 1. The test passageway 9 makes it possible to test a sealed nature of the electrical housing 1 when in the assembled and closed state. In the shown embodiment, the test passageway 9 has a circular section with a diameter of approximately 3.5 millimeters (mm). In another embodiment, the test passageway 9 can have a geometry and a shape which are different from that shown in FIG. 1, provided it can be closed up in a sealed manner by a plug.

An inner end 13 of the test passageway 9 situated inside the electrical housing 1, as shown in FIG. 1, faces a stop element 15 integrally fixed to an opening wall 17 surrounding the opening 3*c*. Thus, a user, for example using a finger, cannot come into contact with the live inner parts of the electrical housing 1. Even an introduction of a wire or a cable having a diameter of approximately 2.6 mm into the test passageway 9 does not present a danger to the user because the opening wall 17 impedes access from the exterior 11 of the electrical housing 1 to the inner parts of the electrical housing 1. The test passageway 9 also has an external end 19 corresponding to the entry of the test passageway 9.

Figure 2:
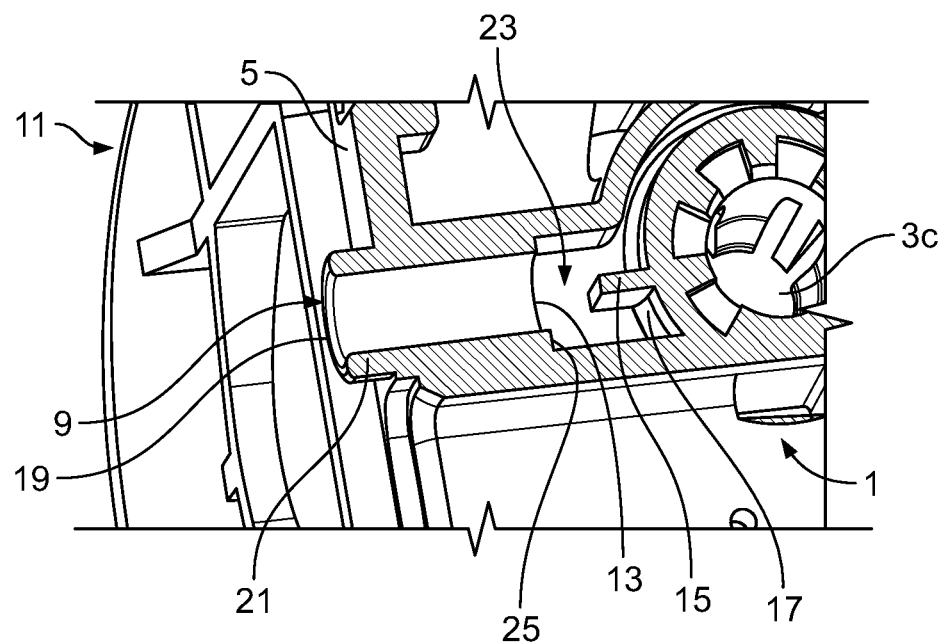
FIG. 2 is a sectional perspective view of a test passageway of the electrical housing.

As shown in FIG. 2, the external end 19 of the test passageway 9, on a side of the housing wall 5 exposed to the exterior 11 of the electrical housing 1, has an exterior edge 21 adapted to receive an interface of a testing tool for testing the sealed nature, described in greater detail below with reference to FIGS. 5A-5C.

The test passageway 9 is positioned and dimensioned to satisfy at least the IP-XXD-level protection rating of the International Electrotechnical Commission Standard IEC 60529 published on 29 Aug. 2013. The International Electrotechnical Commission Standard IEC 60529 published on 29 Aug. 2013 cited above refers to the consolidated version of IEC 60529 bearing edition number 2.1. This version includes the second edition (1989) [documents 70(CO)13+ 70(CO)15) and 70(CO)16+70(CO)17], its corrigendum 1 (2003), its corrigendum 2 (2007), its corrigendum 3 (2009), its amendment 1 (1999) [documents 70/91/FDIS and 70/92/RVD] and its amendment 2 [documents 70/122/FDIS and 70/123/RDV]. The IP-XXD-level protection rating of the electrical housing 1 guarantees the protection of a person from accessing dangerous parts with electrical wires and/or cables of the electrical housing 1 which are live. This rating, relating to the sealed nature, classes the level of protection offered by electrical housings against intrusions by solid and liquid bodies. A user's finger cannot enter into contact with the live parts. Furthermore, according to the demands of the Standard, even an introduction of a wire or a cable of approximately 1 mm in diameter does not present a danger for the user. In particular, the dimensions and the positioning of the test hole of the electrical housing is such that the 1 mm diameter touch test of the Standard IEC60529 for the IP-XXD rating cannot reach electrified parts.

As shown in FIG. 2, the stop element 15 which is integral with the opening wall 17 extends inside a space 23 situated between the inner end 13 of the test passageway 9 and the opening wall 17. The stop element 15 impedes access to the potentially dangerous inner parts of the electrical housing 1, which makes it possible to satisfy the IP-XXD level of the Standard IEC 60529 published on 29 Aug. 2013 and therefore to guarantee the protection of persons from accessing dangerous parts with wires and/or cables of the internal volume 7 of the electrical housing 1. The space 23 has a larger cross-section than that of the test passageway 9. This difference in the dimensions of the cross-sections forms an interior edge 25 at the test passageway 9 and space 23 interface.

Figure 3:
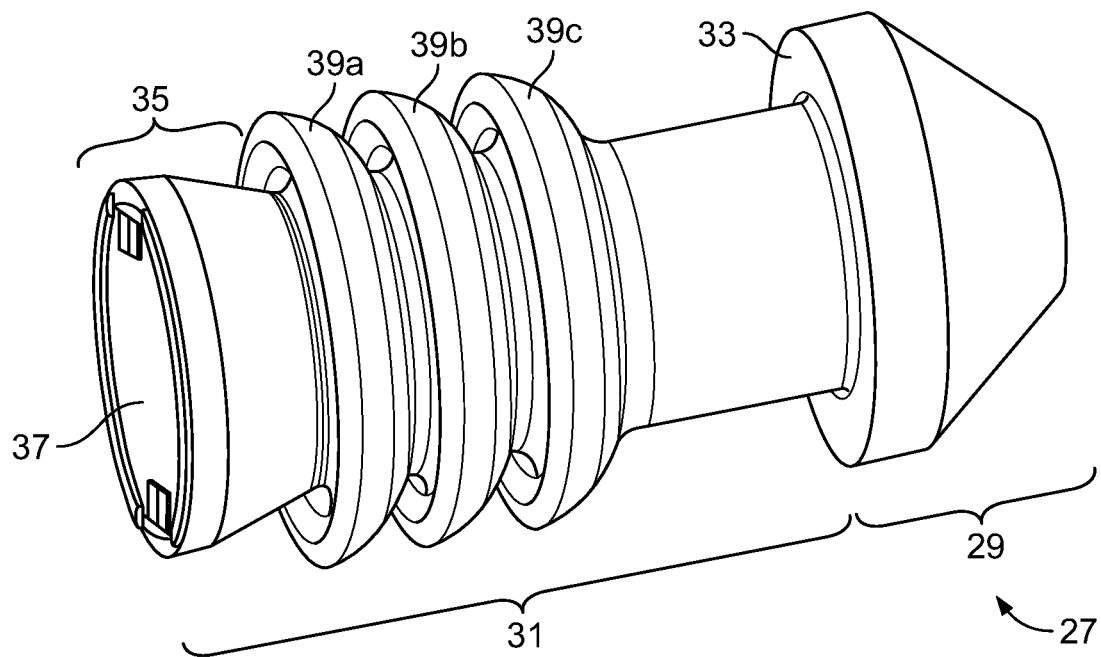
FIG. 3 is a perspective view of a sealing plug.

A sealing plug 27 according to an embodiment, as shown in FIG. 3, has a head 29 and a body 31. The head 29 of the sealing plug 27 has a cone frustum shape, a base 33 of which is integral with the substantially cylindrical body 31. An area of the base 33 of the cone frustum of the head 29 of the sealing plug 27 is greater than a cross-section of the body 31 and greater than a cross-sectional area of the test passageway 9. The body 31 of the sealing plug 27, as shown in FIG. 3, has an end 35, an external base 37 of which is wider than the cross-section of the body 31. A geometry of the end 35 of the sealing plug 27 improves its sealing qualities when introduced into a hole which is to be plugged. The body 31 of the sealing plug 27 has a plurality of blades 39a, 39b, 39c which allow the sealing plug 27 to augment its sealed nature and ensure its durable hold when the sealing plug 27 is introduced into a hole which is to be plugged. The dimensions of the sealing plug 27 are such that the hole which is to be plugged can be closed in a sealed manner by the plug 27. The sealing plug 27 is made of elastic material, such as silicone, in order to adapt to the hole of the electrical housing into which it is introduced and guarantee tight blocking. The sealing plug 27 is also capable of being elastically deformed while it is being introduced into a hole which is to be plugged.

Figure 4:
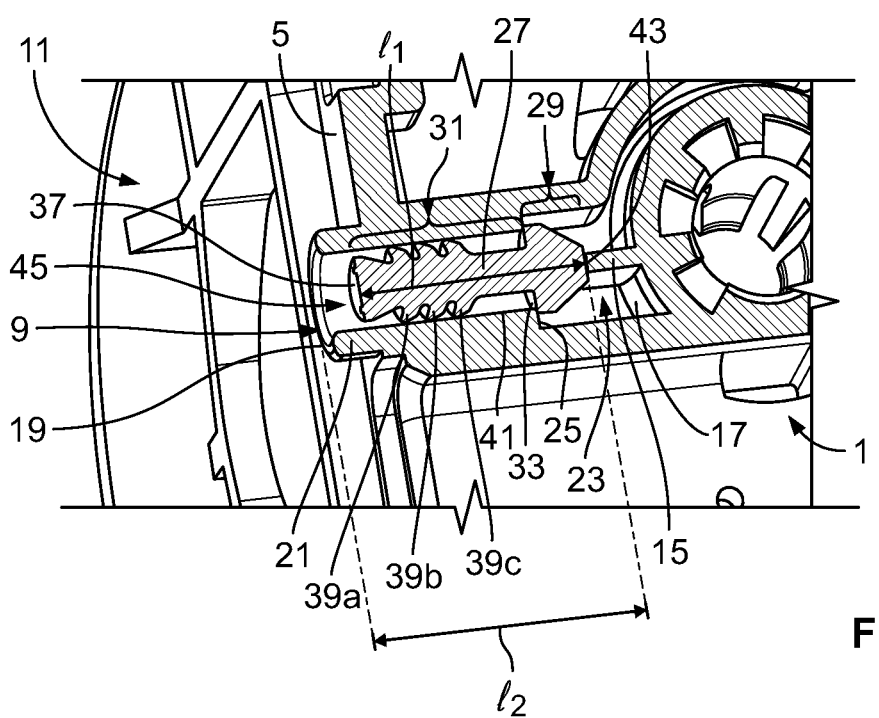
FIG. 4 is a sectional perspective view of an assembly including the sealing plug disposed in the test passageway of the electrical housing.

An assembly according to an embodiment of the invention is shown in FIG. 4 and includes the electrical housing 1 and the sealing plug 27. The sealing plug 27 is fully introduced into the test passageway 9 such that the head 29 comes to a stop on the stop element 15 and the base 33 of the head 29 rests on the interior edge 25. As the head 29 of the sealing plug 27 has a cone frustum shape, the area of the base 33 of which is greater than the cross-section of the test passageway 9, the head 29 of the sealing plug 27 has been deformed elastically during its introduction into the test passageway 9. The sealing plug 27 is thus constantly nested in the test passageway 9 because the head 29 of the sealing plug 27 exerts a pressure on the stop element 15 and on the edge 25 of the electrical housing 1 in this configuration of positive locking. Consequently, the risk of the sealing plug 27 becoming unnested, which is associated with the use of such a device in environments subject to impacts and/or to vibrations, for example in automotive vehicles, is reduced. An involuntary loss of the sealing plug 27 is thus avoidable. It nevertheless remains possible to intentionally remove the sealing plug 27 from the test passageway 9 by reopening the electrical housing 1 and pushing the sealing plug 27 towards the exterior 11 of the electrical housing 1.

As shown in FIG. 4, the blades 39a to 39c allow the body 31 of the sealing plug 27 to fit against an internal wall 41 of the test passageway 9 and seal the closure of the test passageway 9 of the electrical housing 1. The sealing plug 27, which is configured to seal the electrical housing 1 once lodged in the test passageway 9 of the electrical housing 1, has a longitudinal length 11 which is smaller than a distance 12 between a tip 43 of the stop element 15 and the housing wall 5 of the exterior edge 21 at the exterior 11 of the test passageway 9. This dimensional characteristic supplies the entry 19 of the test passageway 9 with a free test space 45 delimited by the housing wall 5 of the edge 21.

The use of the electrical housing 1 and of the assembly comprising the electrical housing 1 and the sealing plug 27, and of testing a sealed nature of the assembly, is described below with reference to FIGS. 5A-5C. FIGS. 5A-5C illustrate the steps of the process according to an embodiment for testing the sealed nature of the electrical housing 1.

Figure 5A:
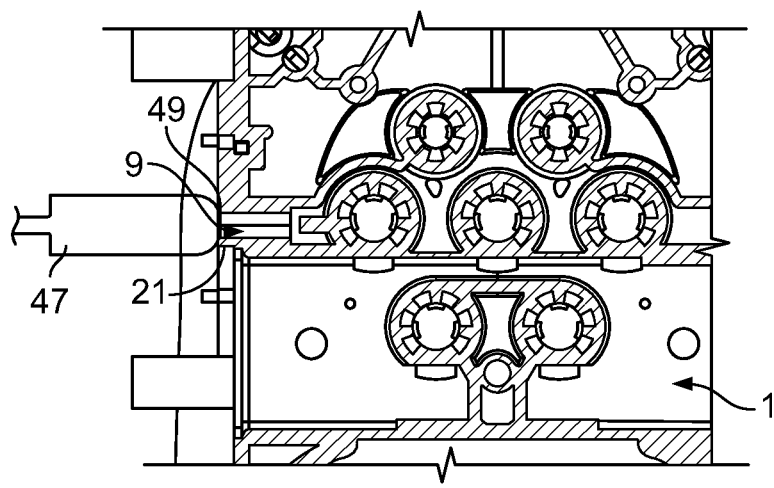
FIG. 5A is a sectional front view of a first step of a process for testing a sealed nature of the electrical housing.

A first step of testing the sealed nature of the electrical housing 1 is shown in FIG. 5A. The step is conducted when electric cabling of the electrical housing 1 is assembled with a harness and/or corresponding cable bundles and the cover of the electrical housing 1 is closed. During the first step shown in FIG. 5A, a tool 47, capable of injecting a fluid under a given pressure to carry out the sealed nature test, is put in contact with the exterior edge 21 of the test passageway 9. There is no leakage at an interface of the tool 47 and the exterior edge 21 through use of a joint 49 at the interface between the tool 47 and edge 21. A fluid, air, nitrogen, or helium for example, is injected by the tool 47 via the test passageway 9 into the electronic housing 1 which is thus put under pressure. The volume of fluid injected is determined by measuring volume or flow/time of said fluid applied to place the electrical housing 1 under pressure. A predetermined initial pressure value P1 is then measured. A second pressure value P2 is measured after a certain predetermined time t0. The difference between the initial value and the second value is determined. If this pressure difference is lower than a certain predetermined threshold, the electronic housing 1 is considered to be sealed. Otherwise, the electronic housing 1 is not considered to be hermetically sealed.

Figure 5B:
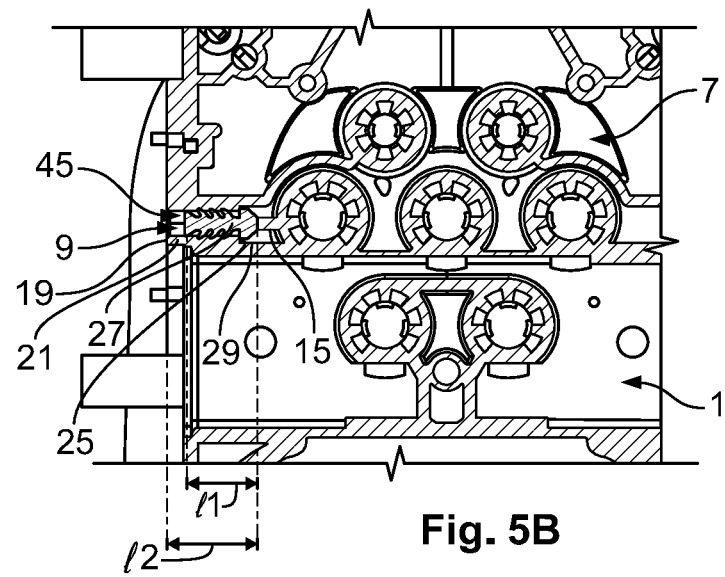
FIG. 5B is a sectional front view of a second step of the process for testing the sealed nature of the electrical housing.

In a second step of testing the sealed nature of the electrical housing 1, shown in FIG. 5B, the sealing plug 27 is used to close the test passageway 9. The sealing plug 27 is inserted until the head 29 of the sealing plug 27 comes to a stop on the stop element 15. The sealing plug 27 is thus positively locked inside the test passageway 9 because the head 29 of the sealing plug 27 exerts a pressure on the stop element 15 and on the interior edge 25 of the electrical housing 1.

The second step of the process for testing the sealed nature of the electrical housing 1 also comprises a step of verifying the presence of the sealing plug 27 in the test passageway 9 and a step of monitoring the position of the sealing plug 27 in the test passageway 9. The monitoring of the position of the sealing plug 27 in the test passageway 9 includes verifying that the sealing plug 27 is mechanically locked with respect to the electrical housing 1. The sealing plug 27 introduced in the second step of the process has a longitudinal length 11 so as to provide the test passageway 9 with the free test space 45 at the entry 19 of the test passageway 9. The longitudinal length 11 is thus shorter than the length 12 which extends from the stop element 15 to the exterior 11 of the housing wall 5 of the electrical housing 1 and can be verified.

Figure 5C:
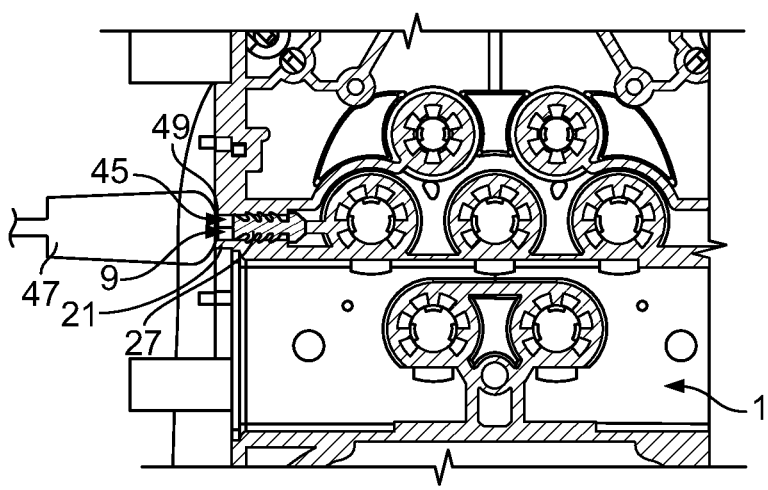
FIG. 5C is a sectional front view of a third step of the process for testing the sealed nature of the electrical housing.

A third step of the process, shown in FIG. 5C, comprises testing the sealed nature of the closure of the test passageway 9 closed by the sealing plug 27. The testing of the sealed nature of the closure of the test passageway 9 is made possible and reliable due to the free test space 45 which provides the suitable space for carrying out such a test. The total volume of the free test space 45 and of the internal volume of the tool 47 is configured to match the sensitivity of the tool 47.

The volume of fluid injected during the pressurization in the third step is determined in order to ensure that the test space 45 is tested and not the volume corresponding to both the test space 45 and the internal volume 7 of the electrical housing 1; the sealed nature of the internal volume 7 of the electrical housing 1 has already been tested during the first step of the process shown in FIG. 5A. The electrical housing 1 is therefore considered to be sealed during the third step of the process. The issue now is to determine the sealed nature of the closure of the test passageway 9, a leakage from which could be caused by a fault at the test passageway 9 or at the sealing plug 27, due to incorrect placement of the sealing plug 27 or due to the absence of a sealing plug 27.

During the third step shown in FIG. 5C, the tool 47 injects a fluid to carry out a sealed-nature test, and is put in contact with the exterior edge 21 of the test passageway 9 in such a manner that there is no leakage at the interface of the tool 47 and the exterior edge 21. A fluid, the same fluid as during the first step in an embodiment, is injected by the tool 47 into the free test space 45 which is thus placed under pressure. An initial pressure value P3 is thus determined. A second pressure value P4 is then measured after a certain predetermined time t1. The difference between the initial value and the second value is then determined. If this pressure difference is lower than a certain predetermined threshold, the closure of the test passageway 9 is considered to be sealed. In this case, given that the free test space 45 is closed in a sealed manner, on the side of the internal volume 7 of the electrical housing 1 by the sealing plug 27, the sealing plug 27 is itself considered to be sealed. Consequently, since the sealing plug 27 constitutes the blocking of the internal volume 7 of the electrical housing 1, it is therefore considered that the internal volume 7 of the electrical housing 1 is also sealed. Otherwise, the closure of the test passageway 9 is not considered to be sealed and therefore the internal volume 7 of the electrical housing 1 is not considered to be either.

Using a test passageway 9 in the electrical housing 1, it becomes possible to make the sealed-nature test more reliable by avoiding carrying out the sealed-nature test on one of the electrical cables introduced into the openings 3a to 3i of the electrical housing 1, such as in the prior art. Indeed, in contrast to the prior art, the parameters of the sealed-nature test are known, notably the dimensions of the test passageway 9, which makes the measurement repeatable and makes the measuring results easier to interpret.

What is claimed is:

1. An assembly, comprising:
   an electrical housing including an opening adapted to receive an electrical cable and/or an electrical connector, a housing wall delimiting an internal volume of the electrical housing, a test passageway having a dimension and a position in the housing wall adapted to permit testing of a sealed nature of the electrical housing while impeding access to an electrically live element in the internal volume of the electrical housing, and a stop element disposed at an inner end of the test passageway inside the electrical housing; and
   a sealing plug adapted to be inserted into the test passageway and sealing the electrical housing, the stop element is adapted to stop insertion of the sealing plug into the test passageway, a longitudinal length of the sealing plug is smaller than a distance between the stop element and an exterior of the housing wall.

2. The assembly of claim 1, wherein the longitudinal length of the sealing plug forms a free test space inside the test passageway between an end of the sealing plug and the exterior of the housing wall.

3. The assembly of claim 1, wherein the sealing plug has a head and a body, the head faces the stop element and has a cross-sectional area greater than a cross-sectional area of the test passageway.

4. The assembly of claim 3, wherein the body of the sealing plug has a blade.

5. The assembly of claim 3, wherein the sealing plug is positively locked onto the electrical housing inside the test passageway, the head of the sealing plug exerts a pressure on the stop element and/or on an interior edge of the test passageway.

* * * * *